(12) United States Patent
Yu

(10) Patent No.: US 7,612,368 B2
(45) Date of Patent: Nov. 3, 2009

(54) ORGANIC BOTTOM EMISSION ELECTRONIC DEVICE

(75) Inventor: Gang Yu, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 331 days.

(21) Appl. No.: 11/025,122

(22) Filed: Dec. 29, 2004

(65) Prior Publication Data

US 2006/0139275 A1    Jun. 29, 2006

(51) Int. Cl.
*H01L 51/52* (2006.01)
(52) U.S. Cl. .................. 257/40; 257/103; 257/E51.022
(58) Field of Classification Search .................. 257/103, 257/40, E51.022
See application file for complete search history.

(56) References Cited

U.S. PATENT DOCUMENTS

| | | | |
|---|---|---|---|
| 6,483,123 B1 | 11/2002 | Kim et al. | |
| 6,618,029 B1 | 9/2003 | Ozawa | |
| 6,744,198 B2 | 6/2004 | Hirabayashi | |
| 6,781,321 B2 | 8/2004 | Ko et al. | |
| 2003/0052869 A1 * | 3/2003 | Fujii et al. | 345/204 |
| 2003/0141504 A1 * | 7/2003 | Kuwabara et al. | 257/66 |
| 2003/0146693 A1 * | 8/2003 | Ishihara et al. | 313/504 |
| 2004/0027056 A1 | 2/2004 | Chino | |
| 2004/0108978 A1 | 6/2004 | Matsueda et al. | |
| 2004/0130516 A1 | 7/2004 | Nathan et al. | |
| 2004/0135181 A1 | 7/2004 | Yamazaki et al. | |
| 2004/0164303 A1 * | 8/2004 | Anzai | 257/72 |
| 2004/0256978 A1 | 12/2004 | Yu et al. | |
| 2005/0012694 A1 * | 1/2005 | Park et al. | 345/76 |

* cited by examiner

*Primary Examiner*—Ahn Phung
*Assistant Examiner*—Michael Lulis
(74) *Attorney, Agent, or Firm*—John H. Lamming

(57) ABSTRACT

An organic electronic device includes a pixel. In one embodiment, the organic electronic device is a bottom emission electronic device. The pixel has an aperture ratio of at least 40%. In another embodiment, the pixel has a first side and a second side opposite the first side. From a plan view, the data line and the first power supply line have lengths that extend along the length of the pixel and lie closer to the first side compared to the second side. In still another embodiment, an organic electronic device includes a substrate, a data line, and a power supply line. The pixel includes a select transistor and a driving transistor. Within the first pixel, each of the data line and the first power supply line lies closer to the substrate compared to the select transistor.

18 Claims, 8 Drawing Sheets

ORGANIC BOTTOM EMISSION ELECTRONIC DEVICE

BACKGROUND OF THE INVENTION

1. Field of the Invention

This invention relates in general to electronic devices, and more particularly, to organic electronic devices including pixels.

2. Description of the Related Art

Electronic devices, including organic electronic devices, continue to be more extensively used in everyday life. Examples of organic electronic devices include Organic Light-Emitting Diodes ("OLEDs"). Active Matrix OLED ("AMOLED") displays include pixels each having a pixel circuits.

A conventional pixel has a rectangular shape with a pair of shorter opposing sides along the width of the pixel, and a pair of longer opposing sides along the length of the pixel. In one conventional layout, the data and $V_{dd}$ lines that are connected to a pixel lie along opposite sides of the pixel, and the OLED lies between those data and $V_{dd}$ lines. A typical layout for a pixel has a pixel driving circuit, such that, from a plan view, an area occupied by the pixel driving circuit lies between the longer sides and extends from one of the shorter sides partially toward the other shorter side. That same layout has an area occupied by the OLED that lies between the longer sides and extends from the other shorter side towards the pixel driving circuit. The aperture ratio using this layout is typically no greater than 35% for a bottom emission electronic device.

SUMMARY OF THE INVENTION

An organic electronic device includes a pixel. In one embodiment, the pixel includes a pixel driving circuit and a first electronic component coupled to the pixel driving circuit. The organic electronic device is a bottom emission electronic device. The pixel has an aperture ratio of at least 40%.

In another embodiment, an organic electronic device includes a first pixel having a first side and a second side opposite the first side. The first and second sides extend along a length of the first pixel. The organic electronic device further includes a data line coupled to the first pixel and a first power supply line coupled to the first pixel. From a plan view, the data line and the first power supply line have lengths that extend along the length of the first pixel and lie closer to the first side compared to the second side.

In still another embodiment, an organic electronic device includes a substrate, a data line, a first power supply line, and a first pixel. The first pixel includes a pixel driving circuit overlying the substrate, wherein the pixel driving circuit includes a select transistor and a driving transistor. The data line is connected to the select transistor, and the first power supply line is coupled to the driving transistor. Within the first pixel, each of the data line and the first power supply line lies closer to the substrate compared to the select transistor.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
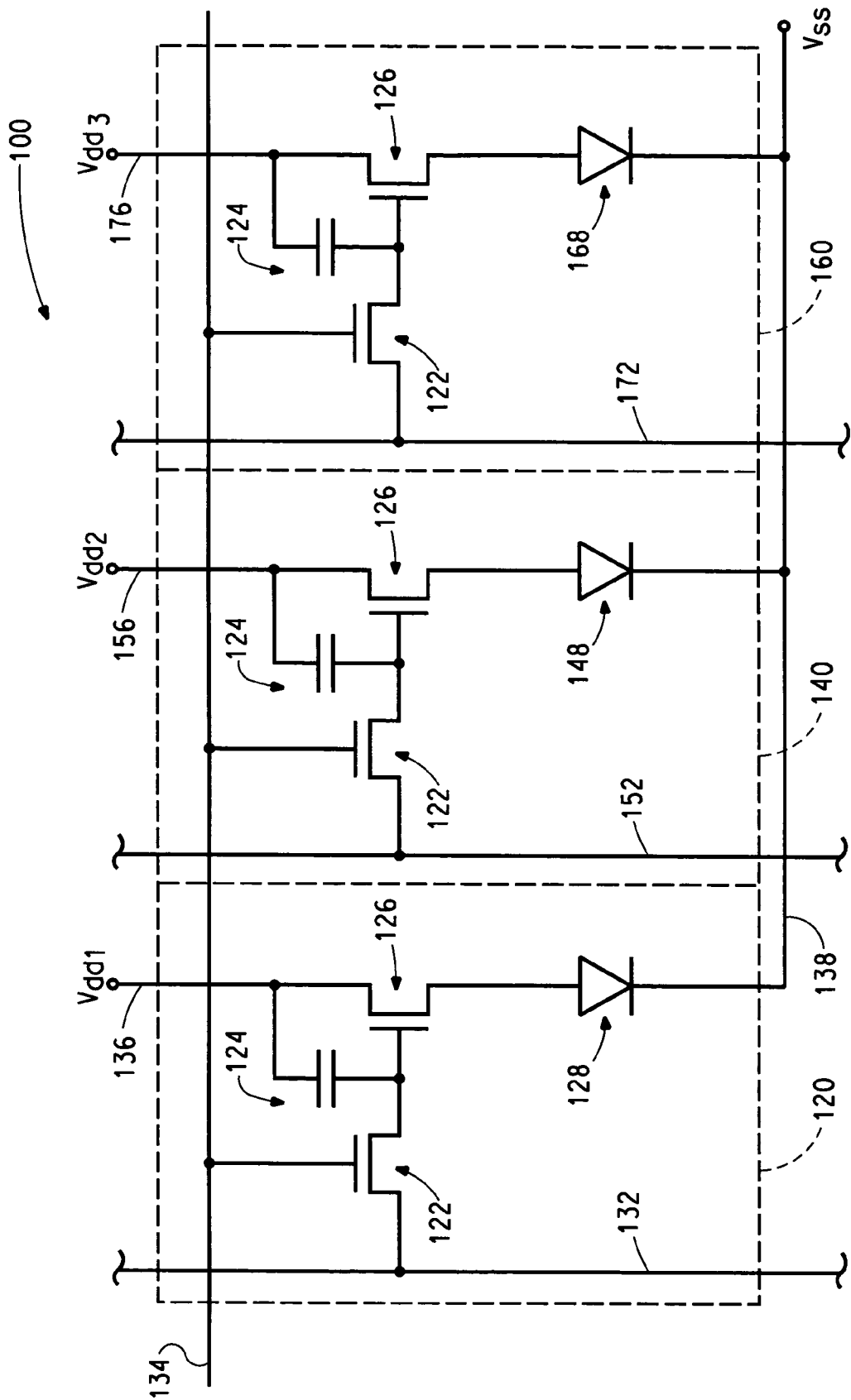
FIG. 1 includes a circuit diagram including pixel circuits within an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An organic electronic device includes a pixel. In one embodiment, the pixel includes a pixel driving circuit and a first electronic component coupled to the pixel driving circuit. The organic electronic device is a bottom emission electronic device. The pixel has an aperture ratio of at least 40%. In another embodiment, the aperture ratio is at least 53%, and in still another embodiment, the aperture ratio is at least 56%.

In yet another embodiment, the pixel driving circuit includes a select transistor and a driving transistor. In a specific embodiment, the pixel includes a side that extends along a length of the pixel. The first electronic component has a radiation-emitting or radiation-responsive area. From a plan view, all electronic components within the pixel driving circuit lie between the side of the pixel and the radiation-emitting or radiation-responsive area of the first electronic component. From the plan view, the pixel driving circuit extends along at least half of the length of the side of the pixel. In a more specific embodiment, the organic electronic device further includes a substrate structure including a black layer that lies between at least a portion of the pixel driving circuit and the radiation-emitting or radiation-responsive area of the first electronic component.

In another specific embodiment, the organic electronic device further includes a substrate, a data line connected to the select transistor, and a power supply line coupled to the driving transistor. Within the pixel, each of the data line and the power supply line lie closer to the substrate compared to the select transistor.

In yet another embodiment, the pixel further includes a first side and a second side opposite the first side, wherein the first and second sides extend along a length of the pixel. A data line is coupled to the pixel, and a power supply line is coupled to the pixel. From a plan view, the data line and the power supply line have lengths that extend along the length of the pixel and lie closer to the first side compared to the second side.

In one embodiment, an organic electronic device includes a first pixel having a first side and a second side opposite the first side. The first and second sides extend along a length of the first pixel. The organic electronic device further includes a data line coupled to the first pixel and a first power supply line coupled to the first pixel. From a plan view, the data line and the first power supply line have lengths that extend along the length of the first pixel and lie closer to the first side compared to the second side.

In another embodiment, the organic electronic device further includes a substrate. The first pixel includes a select transistor and a driving transistor. The data line is connected to the select transistor, and the first power supply line is coupled to the driving transistor. Within the first pixel, each of the data line and the first power supply line lie closer to the substrate compared to the select transistor. In a specific embodiment, the organic electronic device further includes a substrate and a select line. With the first pixel, each of the data line and the first power supply line lies between the substrate and the select line, and the select line lies between the substrate and a channel region of the select transistor. In another specific embodiment, the organic electronic device further includes an electronic component. The electronic component is connected to the driving transistor and a second power supply line.

In still another embodiment, the first pixel further includes a first electronic component having a radiation-emitting or radiation-responsive area and a pixel driving circuit. From the plan view, all electronic components within the pixel driving circuit lie between the first side of the first pixel and the radiation-emitting or radiation-responsive area of the first electronic component, and the pixel driving circuit extends along at least half of the length of the first side of the first pixel. In a specific embodiment, the organic electronic device further includes a second pixel including a second electronic component. The second electronic component has a radiation-emitting or radiation-responsive area. From the plan view, substantially none of the pixel driving circuit of the first pixel lies between the radiation-emitting or radiation-responsive areas of the first and second electronic components.

In one embodiment, an organic electronic device includes a substrate, a data line, a first power supply line, and a first pixel. The first pixel includes a pixel driving circuit overlying the substrate, wherein the pixel driving circuit includes a select transistor and a driving transistor. The data line is connected to the select transistor, and the first power supply line is coupled to the driving transistor. Within the first pixel, each of the data line and the first power supply line lies closer to the substrate compared to the select transistor.

In another embodiment, the organic electronic device further includes a select line. Within the first pixel, each of the data line and the first power supply line lies between the substrate and the select line, and the select line lies between the substrate and a channel region of the select transistor. In still another embodiment, the organic electronic device further includes a first electronic component. The first electronic component is connected to the driving transistor and a second power supply line.

In yet another embodiment, the first pixel includes a first side that extends along a length of the first pixel, and a first electronic component having a radiation-emitting or radiation-responsive area. From a plan view, all electronic components within the pixel driving circuit lie between the first side of the first pixel and the radiation-emitting or radiation-responsive area of the first electronic component, and the pixel driving circuit extends along at least half of the length of the first side of the first pixel. In a specific embodiment, the organic electronic device further includes a second pixel including a second electronic component. The second electronic component has a radiation-emitting or radiation-responsive area. From the plan view, substantially none of the pixel driving circuit of the first pixel lies between the radiation-emitting or radiation-responsive areas of the first and second electronic components.

In a further embodiment, from a plan view, the data line and the power supply line have lengths that extend along a length of the first pixel and lie closer to the first side compared to the second side.

The detailed description first addresses Definitions and Clarification of Terms followed by Circuit Diagram, Pixel Layout and Electronic Device Fabrication, Other Embodiments, and finally, Advantages.

1. Definitions and Clarification of Terms

Before addressing details of embodiments described below, some terms are defined or clarified. The term "amorphous silicon" ("a-Si") is intended to mean one or more layers of silicon having no discernible crystalline structure.

The term "aperture ratio" is intended to mean a ratio of the area of the pixel available for emitting or responding to radiation to the total area of a pixel. The aperture ratio is typically expressed as a percentage.

The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "black layer" is intended to mean a layer that transmits no more than approximately 10% of radiation at a targeted wavelength or spectrum.

The term "bottom emission," when referring to a display or other electronic device, is intended to mean that (a) radiation from a radiation-emitting component is designed to be emitted through the substrate over which the radiation-emitting component is formed, (b) radiation to a radiation-responsive component is designed to be received through the substrate over which the radiation-responsive component is formed, or (c) any combination thereof.

The term "channel region" is intended to mean a region lying between source/drain regions of a field-effect transistor, whose biasing, via a gate electrode of the field-effect transistor, affects the flow of carriers, or lack thereof, between the source/drain regions.

The term "circuit" is intended to mean a collection of electronic components that collectively, when properly connected and supplied with the proper potential(s), performs a function. A TFT driver circuit for an organic electronic component is an example of a circuit.

The term "connected," with respect to electronic components, circuits, or portions thereof, is intended to mean that two or more electronic components, circuits, or any combination of at least one electronic component and at least one circuit do not have any intervening electronic component lying between them. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "continuous grain silicon" ("CGS") is intended to mean a type of polysilicon in which individual crystals are oriented in a direction parallel to the channel length of a field-effect transistor. The oriented crystals reduce the frequency with which a charge encounters a grain boundary, resulting in an overall higher mobility of the channel region compared to a randomly oriented polysilicon channel.

The term "coterminous" is intended to mean having the same or coincident boundaries.

The term "coupled" is intended to mean a connection, linking, or association of two or more electronic components, circuits, systems, or any combination of at least two of: (1) at least one electronic component, (2) at least one circuit, or (3) at least one system in such a way that a signal (e.g., current, voltage, or optical signal) may be transferred from one to another. A non-limiting example of "coupled" can include a direct connection between electronic component(s), circuit(s) or electronic component(s) or circuit(s) with switch(es) (e.g., transistor(s)) connected between them.

The term "data line" is intended to mean a signal line having a primary function of transmitting one or more signals that comprise information.

The term "design rules" is intended to mean a set of rules or guidelines to which a design of an electronic component, electronic device, or a combination thereof is to comply. A set of design rules is typically referred to by the smallest dimension of a feature that the set of design rules can support.

The term "driving transistor" is intended to mean a transistor, by itself or in conjunction with one or more other electronic components, controls the signal intensity (e.g., amount of current) flowing to another electronic component.

The term "electronic component" is intended to mean a lowest level unit of a circuit that performs an electrical function. An electronic component may include a transistor, a diode, a resistor, a capacitor, an inductor, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "elevation" is intended to mean a shortest distance to a reference plane. In one embodiment, the reference plane is the primary surface of a substrate.

The term "field-effect transistor" is intended to mean a transistor, whose current-carrying characteristics are affected by a voltage on a gate electrode. Field-effect transistors include junction field-effect transistors (JFETs) and metal-insulator-semiconductor field-effect transistors (MISFETs), including metal-oxide-semiconductor field-effect transistors (MOSFETs), metal-nitride-oxide-semiconductor (MNOS) field-effect transistors, or combinations thereof. A field-effect transistor can be n-responsive (n-type carriers flowing within the channel region) or p-channel (p-type carriers flowing within the channel region). A field-effect transistor may be an enhancement-mode transistor (channel region having a different conductivity type compared to the source/drain regions of the same field-effect transistor) or depletion-mode transistor (channel and source/drain regions of the same field-effect transistor have the same conductivity type).

The terms "length" and "width" refer to dimensions as seen from a plan view of an electronic device and are intended to mean a pair of dimensions that are substantially perpendicular to one another, wherein length is equal to or greater than the width.

The term "low-temperature polysilicon" ("LTPS") is intended to mean one or more layers of polysilicon deposited at a temperature no greater than 550° C. One example of a process for forming LTPS is Sequential Lateral Solidification ("SL 362S"), in which a modified excimer laser crystallization ("ELC") process is used to form oriented grains of larger sizes, resulting in higher mobilities for charge carriers, when compared to conventional ELC techniques for forming LTPS.

The term "minimum dimension," when referring to design rules, is intended to mean the smallest dimension of a feature allowed by a set of design rules. For example, the minimum dimension for 4-micron design rules is 4 microns.

The term "organic active layer" is intended to mean one or more organic layers, wherein at least one of the organic layers, by itself or when in contact with a dissimilar material, is capable of forming a rectifying junction.

The term "organic electronic device" is intended to mean a device including one or more organic semiconductor layers or materials. An organic electronic device includes: (1) a device that converts electrical energy into radiation (e.g., a light-emitting diode, light-emitting diode display, diode laser, or lighting panel), (2) a device that detects a signal through an electronic process (e.g., a photodetector (e.g., a photoconductive cell, a photoresistor, a photoswitch, a phototransistor, a phototube), an infrared ("IR") detector, a biosensor), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The term "physical channel length" is intended to mean the actual distance between the source/drain regions of a field-effect transistor.

The term "pixel" is intended to mean a portion of an array corresponding to one electronic component and its corresponding electronic component(s), if any, that are dedicated to that specific one electronic component. In one embodiment, a pixel has an OLED and its corresponding pixel driving circuit Note that a pixel as used in this specification can be a pixel or subpixel as those terms are used by skilled artisans outside of this specification.

The term "pixel circuit" is intended to mean a circuit within a pixel. In one embodiment, the pixel circuit may be used in a display or a sensor array.

The term "pixel driving circuit" is intended to mean a circuit within a pixel that controls signal(s) for no more than one electronic component driving by such circuit.

The term "polysilicon" is intended to mean a layer of silicon made up of randomly oriented crystals.

The term "power supply line" is intended to mean a signal line having a primary function of transmitting power.

The term "primary surface" is intended to mean a surface of a substrate from which an electronic component is or has been subsequently formed.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or IR). A light-emitting diode is an example of a radiation-emitting component.

The term "radiation-responsive component" is intended to mean an electronic component can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "rectifying junction" is intended to mean a junction within semiconductor layer or a junction formed by an interface between a semiconductor layer and a dissimilar material in which charge carriers of one type flow easier in one direction through the junction compare to the opposition direction. A pn junction is an example of a rectifying junction that can be used as a diode.

The term "select line" is intended to mean a specific signal line within a set of signal lines having a primary function of transmitting one or more signals used to activate one or more electronic components, one or more circuits, or any combination thereof when the specific signal line is activated, wherein other electronic component(s), circuit(s), or any combination thereof associated with another signal line within the set of signal lines are not activated when the specific signal line is activated. The signals lines within the set of signal lines may or may not be activated as a function of time.

The term "select transistor" is intended to mean a transistor controlled by a signal on a select line, wherein the transistor controls the flow of data to another portion of a pixel driving circuit.

The term "semiconductor" is intended to mean a material that is capable of including or having a rectifying junction formed therein or when such material is in contact with a dissimilar material (e.g., a metal-containing material).

The term "signal" is intended to mean a current, a voltage, an optical signal, or any combination thereof. The signal can be a voltage or current from a power supply or can represent, by itself or in combination with other signal(s), data or other information. Optical signals can be based on pulses, intensity, or a combination thereof. Signals may be substantially constant (e.g., power supply voltages) or may vary over time (e.g., one voltage for on and another voltage for off).

The term "signal line" is intended to mean a line over which one or more signals may be transmitted. The signal to be transmitted may be substantially constant or vary. Signal lines can include control lines, data lines, scan lines, select lines, power supply lines, or any combination thereof. Note that signal lines may serve one or more principal functions.

The term "source/drain region" is intended to mean a region of a field-effect transistor that injects charge carriers into a channel region or receives charge carriers from the channel region. A source/drain region can include a source region or a drain region, depending on the flow of current through the field-effect transistor. A source/drain region may act as source region when current flows in one direction through the field-effect transistor, and as a drain region when current flows in the opposite direction through the field-effect transistor.

The term "substantially perpendicular" is intended to mean that any combination of one or more lines, one or more line segments, or one or more planes are perpendicular to one another or almost perpendicular such that any deviation is considered to be insignificant to one of ordinary skill in the art.

The term "substrate" is intended to mean a workpiece that can be either rigid or flexible and may be include one or more layers of one or more materials, which can include, but are not limited to, glass, polymer, metal or ceramic materials or combinations thereof.

The term "substrate structure" is intended to mean a structure overlying a substrate, wherein the structure serves a principal function of separating an area or region into smaller areas or regions. A workpiece structure can include a cathode separator or a well structure.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited to only those elements but may include other elements not expressly listed or inherent to such method, process, article, or apparatus. Further, unless expressly stated to the contrary, "or" refers to an "inclusive or" and not to an "exclusive or." For example, a condition A or B is satisfied by any one of the following: A is true (or present) and B is false. (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Group numbers corresponding to columns within the periodic table of the elements use the "New Notation" convention as seen in the CRC Handbook of Chemistry and Physics, 81st Edition (2000).

To the extent not described herein, many details regarding specific materials, processing acts, and circuits are conventional and may be found in textbooks and other sources within the organic light-emitting display, photodetector, semiconductor, and microelectronic circuit arts. Details regarding radiation-emitting elements, pixels, and pixel circuitry will be addressed before turning to details of the radiation-sensing elements and circuitry.

2. Circuit Diagram

FIG. 1 includes a circuit diagram of a portion of an electronic device 100. The electronic device 100 includes a first pixel 120, a second pixel 140, and a third pixel 160. Each of the pixels 120, 140, and 160 includes a pixel circuit as illustrated in FIG. 1. Each pixel circuit includes a pixel driving circuit and an electronic component 128, 148, or 168.

The first pixel 120 includes a select transistor 122, a capacitive electronic component 124, a driving transistor 126, and an electronic component 128. The electronic component 128 can be nearly any electronic component that is driven by an electrical current. In one embodiment, the electronic component 128 is a radiation-emitting component, such as an OLED. Within pixel 120, the pixel driving circuit includes the select transistor 122, the capacitive electronic component 124, and the driving transistor 126.

The select transistor 122 includes a gate electrode connected to a select line ("SL") 134, a first source/drain region connected to a data line ("DL") 132, and a second source/drain region connected to a first electrode of a capacitive electronic component 124, and a gate electrode of a driving transistor 126. SL 134 provides a control signal for the select transistor 122, and DL 132 provides a data signal to be passed to the capacitive electronic component 124 and the gate electrode of the driving transistor 126 when the select transistor 122 is activated.

The capacitive electronic component 124 includes the first electrode and a second electrode. The first electrode of the capacitive electronic component 124 is connected to the second source/drain region of the select transistor 122 and the gate electrode of the driving transistor 126. The second electrode of the capacitive electronic component 124 is connected to a first power supply line, which in one embodiment is a $V_{dd1}$ line 136. In an alternative embodiment (not illustrated), an optional anti-degradation unit may be connected to the capacitive electronic component 124 and at least one of the power supply lines (e.g., $V_{ss}$ line 138, $V_{dd1}$ line 136, or both) connected to the pixel 120.

The driving transistor 126 includes the first gate electrode, a first source/drain region, and a second source/drain region. The first source/drain region of the driving transistor 126 is connected to a first electrode of the electronic component 128, and the second source/drain region of the driving transistor 126 is coupled to the $V_{dd1}$ line 136. In one embodiment, the second source/drain region of the driving transistor 126 is connected to the $V_{dd1}$ line 136. In another embodiment, the optional anti-degradation unit may be connected to the second source/drain region of the driving transistors 126 and the $V_{dd1}$ line 136.

The electronic component 128 includes the first electrode and a second electrode that is connected to the $V_{ss}$ line 138. In one embodiment, the first electrode is an anode, and the second electrode is a cathode. In another embodiment, the electronic component 128 is an organic, radiation-emitting electronic component, such as an OLED. The rest of the pixel circuit, which is the pixel driving circuit in one embodiment, is well suited for providing a variable current source to drive the electronic component 128. Therefore, one or more electronic components that are current driven may be used in place of or in conjunction with the electronic component 128. Note that one or more electronic components may or may not include a diode.

In another embodiment (not shown), the electronic component 128 and driving transistor 126 may be reversed. More specifically, (1) the first electrode (e.g., anode) of the electronic component 128 is connected to the $V_{dd1}$ line 136, (2) the second electrode (e.g., cathode) of the electronic component 128 is connected to one of the source/drain regions of the driving transistor 126, and (3) the other source/drain region of the driving transistor 126 is connected to the $V_{ss}$ line 138.

The second pixel 140 is similar to the first pixel 120 except that, within the second pixel 140, a data line 152 is connected to a first source/drain region of the select transistor 122, a $V_{dd2}$ line 156 is connected to second source/drain region of the driving transistor 126, and an electronic component 148 is connected between a first source/drain region of the driving transistor 126 and the $V_{ss}$ line 138. The third pixel 160 is similar to the first and second pixels 120 and 140 except that, within the third pixel 160, a data line 172 is connected to a first source/drain region of the select transistor 122, a $V_{dd3}$ line 176 is connected to second source/drain region of the driving transistor 126, and an electronic component 168 is connected between a first source/drain region of the driving transistor 126 and the $V_{ss}$ line 138.

In one embodiment, the electronic components 128, 148, 168 are substantially identical to one another. In another embodiment, the electronic components 128, 148, and 168 are different from one another. For example, the electronic component 128 is a blue light emitting component, the electronic component 148 is a green light emitting component, and the electronic component 168 is a red light emitting component. The $V_{dd1}$, $V_{dd2}$, and $V_{dd3}$ lines 136, 156, and 176 may be at the same or different voltages compared to one another. In another embodiment (not illustrated), the second electrodes of the electronic components 128, 148, 168 may be connected to different power supply lines that may operate at substantially the same or significantly different voltages. After reading this specification, skilled artisans will be able to design the electronic device 100 to meet the needs or desires for a specific application.

The select transistor 122, driving transistor 126, or any combination thereof can include a field-effect transistor. In the circuit for the pixel as illustrated in FIG. 1, all transistors are n-channel transistors. Any one or more of the n-channel transistors can be replaced by any one or more p-channel transistors. In other embodiments, other transistors (including one or more JFETs, one or more bipolar transistors, or any combination thereof) may be used within the select transistor 122.

3. Pixel Layout and Electronic Device Fabrication

FIGS. 2 to 15 include illustrations of plan views and cross-sectional views of a portion of the electronic device during the formation of the circuits as illustrated in FIG. 1. The drawings merely illustrate a few embodiments for a layout and fabrication sequence for forming the electronic components and their interconnects within the circuits. After reading this specification, skilled artisans will appreciate that other layouts may be used in forming the circuits as illustrated in FIG. 1. For simplicity, dielectric and insulating layers are not illustrated in the plan views.

Figure 2:
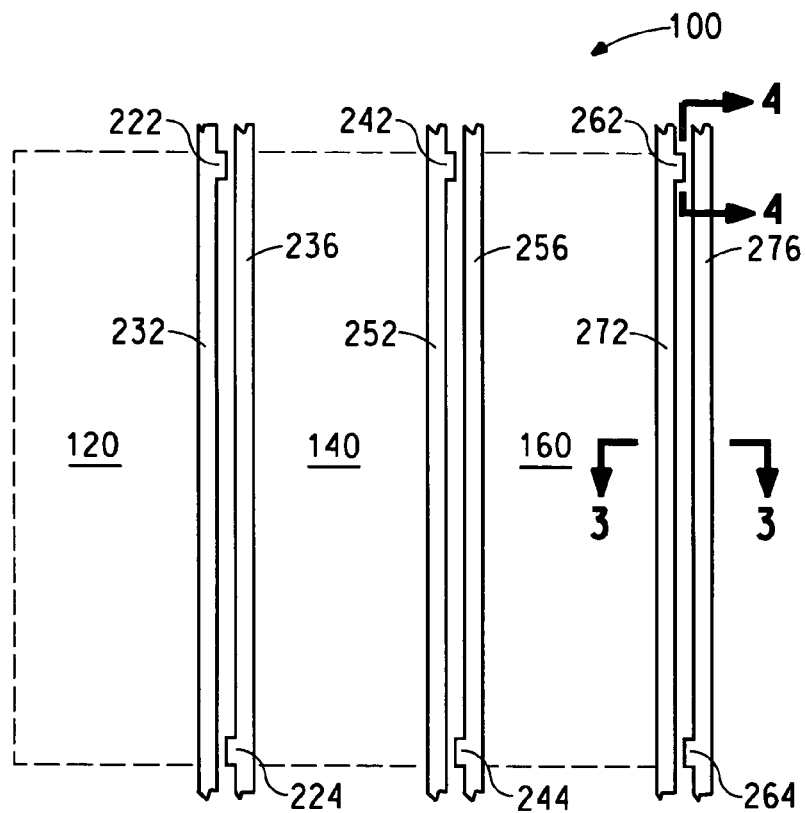
FIGS. 2 and 3 include illustrations of a plan view and a cross-sectional view, respectively, of a portion of an array after forming a first set of conductive members over a substrate.

The areas of a substrate occupied by the pixels 120, 140, and 160 are illustrated by dashed lines in FIG. 2. Conductive members 232, 252, and 272 are portions of data lines 132, 152, and 172 for the pixels 120, 140, and 160, respectively. Portions 222, 242, and 262 of the conductive members 232, 252, and 272, respectively, are locations where connections will be made between the data lines 232, 252, and 272 and the first source/drain regions of the select transistors 122. Conductive members 236, 256, and 276 are portions of $V_{dd1}$, $V_{dd2}$, and $V_{dd3}$ lines 136, 156, and 176 for the pixels 120, 140, and 160, respectively. Portions 224, 244, and 264 of the conductive members 236, 256, and 276, respectively, are locations where connections will be made between the $V_{dd1}$, $V_{dd2}$, and $V_{dd3}$ lines 136, 156, and 176 and the second source/drain regions of the driving transistors 126.

Figure 3:
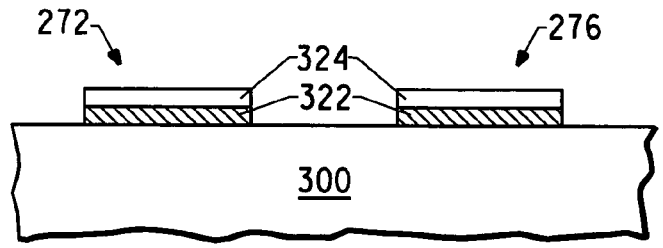

FIG. 3 includes an illustration of a cross-sectional view of a portion of a substrate 300 and the conductive members 272 and 276 as seen at sectioning line 3-3. The substrate 300 can be rigid or flexible and may contain one or more layers of an organic, inorganic, or both organic and inorganic materials. In one embodiment, the electronic device includes a bottom emission display, and the substrate 300 includes a transparent material that allows at least 70% of the radiation incident on the substrate 300 to be transmitted through it.

Each of the conductive members 232, 236, 252, 256, 272 and 276 includes a black layer 322 and a conductive layer 324 and are formed over the substrate 300. In one embodiment, the black layer 322 and the conductive layer 324 can be formed using a conventional deposition and optional patterning sequence. For example, the layers for the black layer 322 and conductive layer 324 can be deposited as patterned layers using a stencil mask. In another embodiment, the layers for the black layer 322 and conductive layer 324 may be sequentially deposited over the substrate 300, and the black layer 322 and the conductive layer 324 may be patterned using a conventional lithographic technique. In still another embodiment, the black layer 322 may be formed over substantially all of the substrate 300, and the conductive layer 324 may be deposited as a patterned layer over the black layer 322. The conductive layer 324 can act as a hard mask during an etching step to remove portions of the black layer 322 that are not covered by the conductive layer 324. In another embodiment, the black layer 322 may be omitted, and the conductive layer 324 may be formed on the surface of the substrate 300. After reading the specification, skilled artisans will appreciate that many other techniques may be used in forming the black layer 322 and the conductive layer 324.

The black layer 322 allows for an improved contrast ratio of the electronic device when used in ambient light conditions. Materials and thicknesses of the black layer are more fully described in U.S. patent application Ser. No. 10/840,807 entitled "Array Comprising Organic Electronic Devices With a Black Lattice and Process For Forming the Same" by Gang Yu et al. filed May 7, 2004. In one embodiment, the black layer 322 includes one or more layers of Cr, Ni, or both.

The conductive layer 324 may include one or more layers that include at least one element selected from Groups 4 to 6, 8 and 10 to 14 of the Periodic Table, or any combination thereof. In one embodiment, the conductive layer 324 can include Cu, Al, Ag, Au, Mo, or any combination thereof. In another embodiment, where the conductive layer 324 includes more than one layer, one of the layers can include can include Cu, Al, Ag, Au, Mo, or any combination thereof and another layer can include Mo, Cr, Ti, Ru, Ta, W, Si, or any combination thereof. Note that conductive metal oxide(s), conductive metal nitride(s) or a combination thereof may be used in place of or in conjunction with any of the elemental metals or alloys thereof. In one embodiment, the conductive layer 324 has a thickness in a range of approximately 0.2 to 5 microns.

Figure 4:
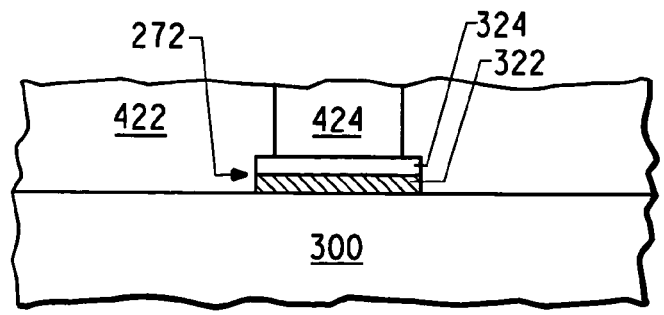
FIG. 4 includes an illustration of a cross-sectional view of the portion of an array of FIG. 3 after forming an insulating layer and a conductive plug.

An insulating layer 422 and conductive plugs 424 are formed over the conductive members 232, 236, 252, 256, 272 and 276. FIG. 4 includes an illustration of a cross-sectional view where the insulating layer 422 and one of the conductive plugs 424 overlie the conductive member 272. The insulating layer 422 can be formed using a conventional deposition technique and can include one or more layers including silicon dioxide, alumina, hafnium oxide, silicon nitride, aluminum nitride, silicon oxynitride, another conventional gate dielectric material as used in the semiconductor arts, or any combination thereof. In one embodiment, thickness of the insulating layer 422 is in a range of approximately 0.1 to 5.0 microns. In another embodiment, the first insulating layer has a thickness in a range of approximately 0.5 to 2.0 microns.

The insulating layer 422 is patterned using a conventional technique to expose a portion of the conductive layer 324.

The conductive plugs 424 can be formed by a conventional selective or blanket deposition technique of one or more conductive layers sufficient to substantially fill the opening within the insulating layer 422. Portions of the conductive layer(s), if any, lying outside the opening in the insulating layer 422 can be removed using a conventional etching or polishing technique. The conductive plugs 424 can include one or more layers, one or more materials, or any combination thereof as described with respect to the conductive layer 324.

Figure 5:
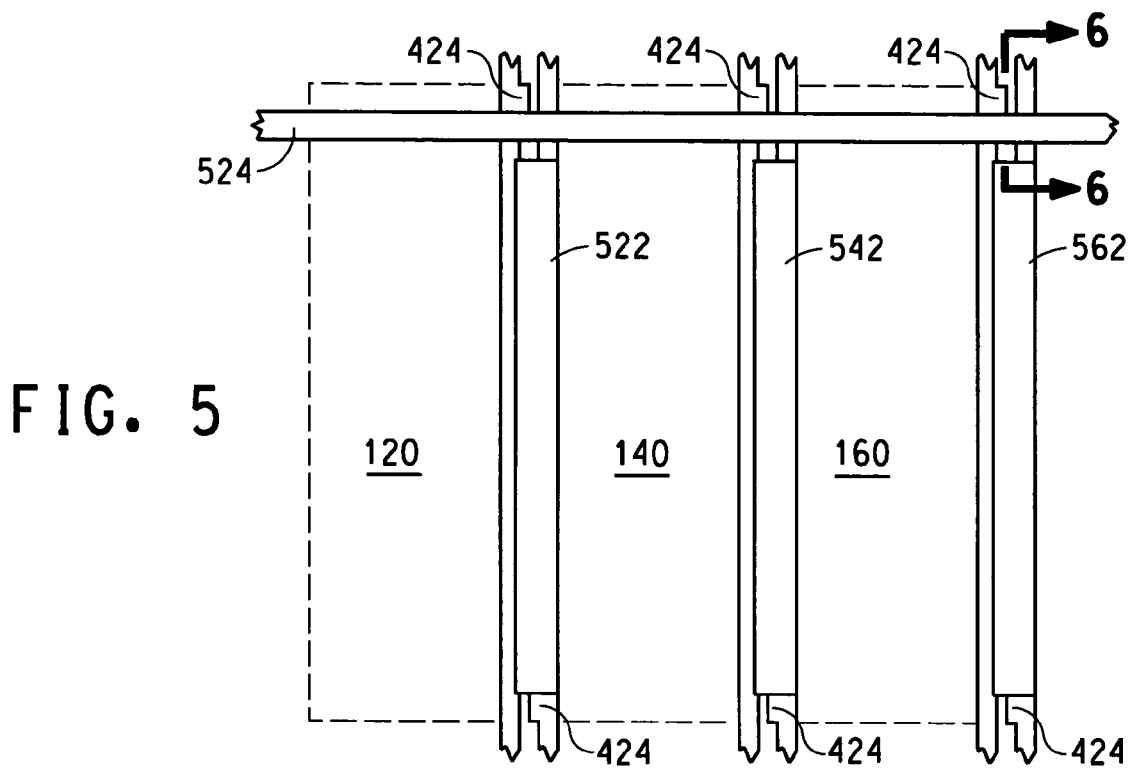
FIGS. 5 and 6 include illustrations of a plan view and a cross-sectional view, respectively, of the portion of an array of FIGS. 2 and 4 after forming a second set of conductive members.
Figure 6:
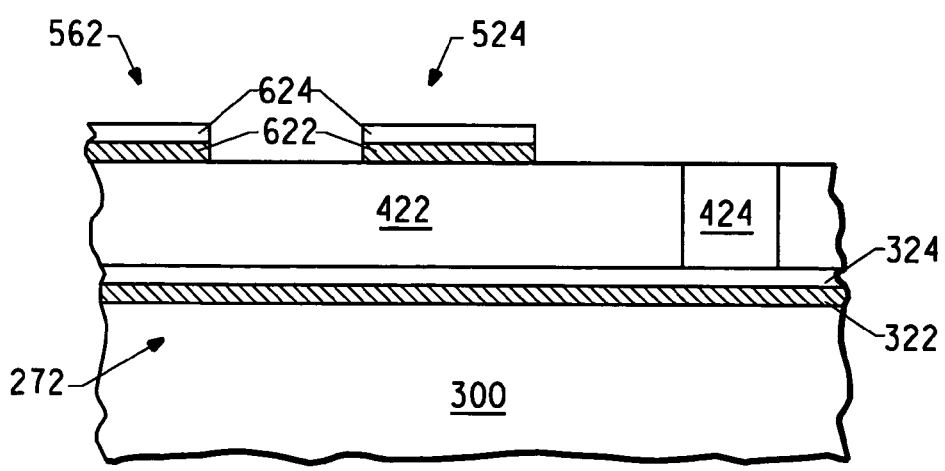

Conductive members 522, 524, 542, and 562 are formed over the portions of one or more of the conductive members 232, 236, 252, 256, 272 and 276 as illustrated in FIGS. 5 and 6. The conductive members 522, 542, and 562 will be the gate electrodes for the driving transistors 126 and the first electrodes for the capacitive electronic elements 124. The conductive member 524 is part of the select line 134.

Each of the conductive members 522, 524, 542, and 562 includes a black layer 622 and a conductive layer 624 is formed over the insulating layer 422. Any one or more of the formation techniques, materials, number of layers, and thicknesses previously described for the black layer 322 and conductive layer 324 can be used for the black layer 622 and conductive layer 624, respectively. In one embodiment, the black layer 622 can be formed using the same formation technique(s), material(s), number of layers, and thickness(es) as the black layer 322. In another embodiment, the black layer 622 can be formed using a different formation technique, material, number of layers, or thickness as the for the black layer 322. In one embodiment, the conductive layer 624 can be formed using the same formation technique(s), material(s), number of layers, and thickness(es) as the conductive layer 324. In another embodiment, the conductive layer 624 can be formed using a different formation technique, material, number of layers, or thickness as the for the conductive layer 324.

In one embodiment, the conductive layer 624 includes a first layer of a relatively higher conductive material (e.g., Al, Cu, Mo) having a thickness in a range of approximately 0.5 to 5.0 microns, and an $n^+$ or a $p^+$ doped Si layer having a thickness in a range of approximately 50 to 500 nm. The $n^+$ or a $p^+$ doped Si layer allows ohmic conducts to be formed to subsequently-formed active regions for the select transistors 122.

Figure 7:
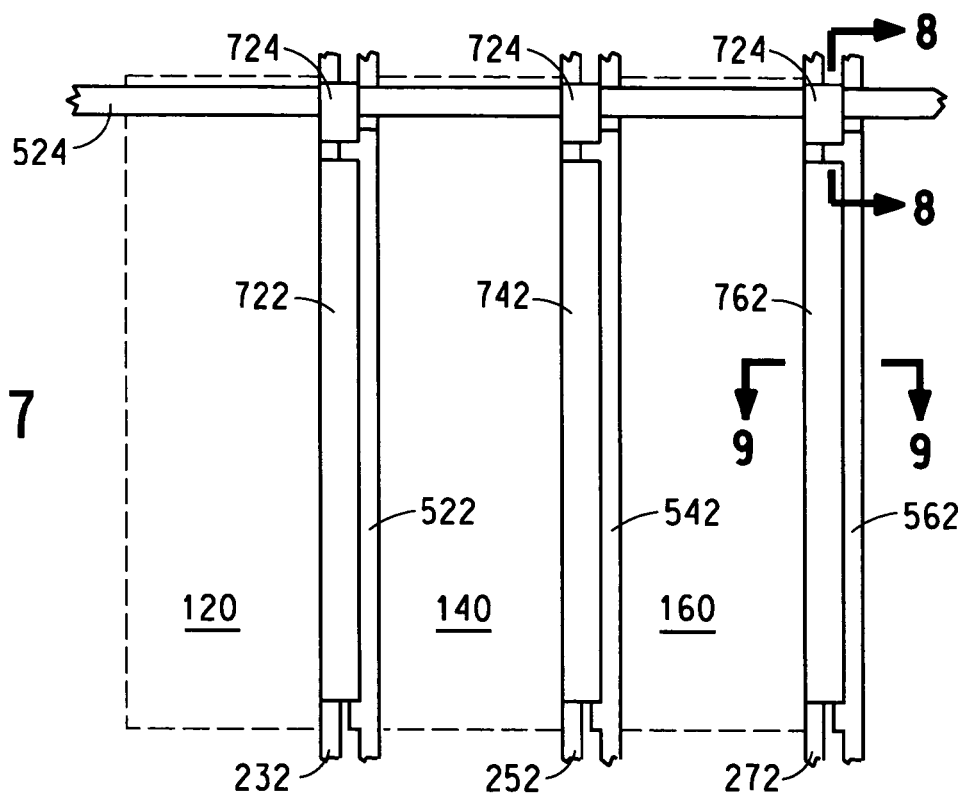
FIGS. 7 to 9 include illustrations of plan and cross-sectional views of the portion of an array of FIGS. 5 and 6 after patterning the first and second semiconductor layers.

A dielectric layer 822 and active regions 722, 724, 742, and 762 are formed over the substrate 300 at locations illustrated in FIG. 7. The active regions 722, 742, and 762 are the active regions of the driving transistors 126, and the active regions 724 are the active regions of the select transistors 122. The formation, composition, and thicknesses of the dielectric layer 822 and active regions 722, 724, 742, and 762 are described in more detail with respect to FIGS. 8 and 9, which are illustrations at sectioning lines 8-8 and 9-9, respectively, in FIG. 7.

Figure 8:
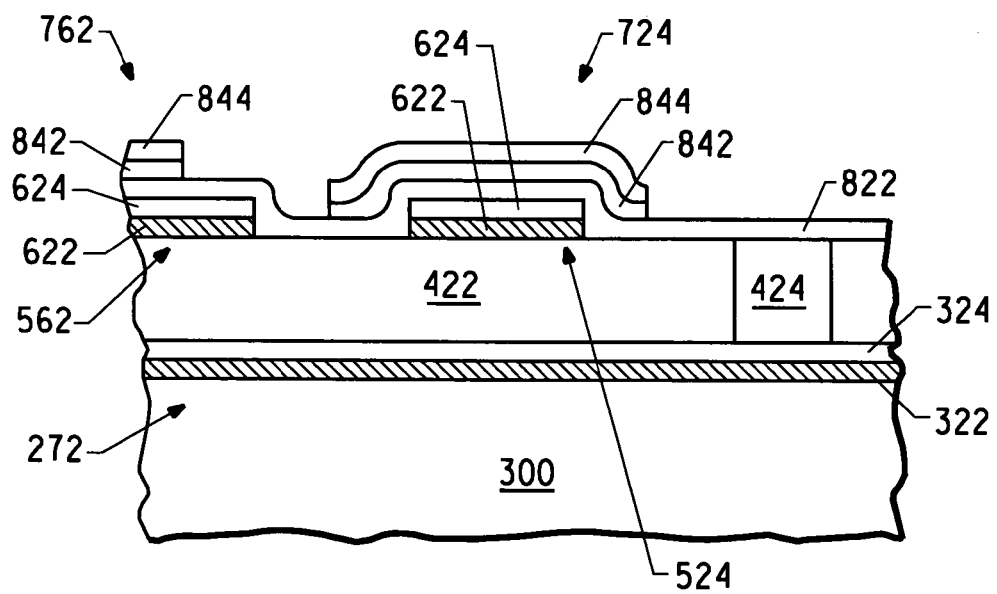
Figure 9:
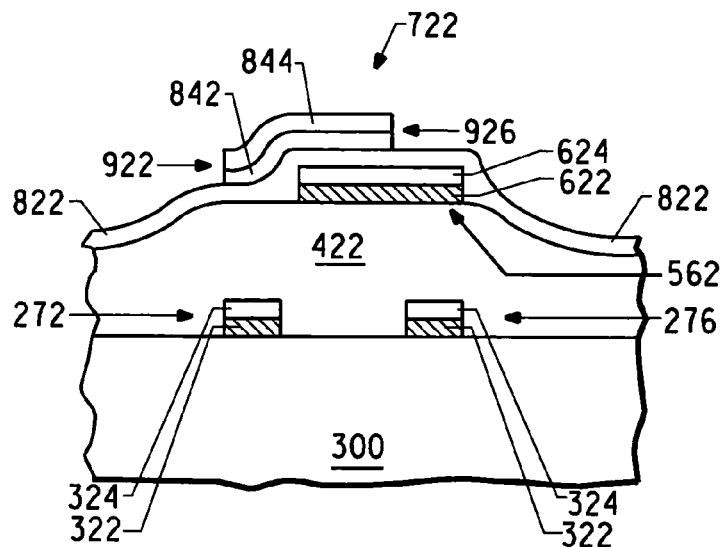

The dielectric layer 822 can be formed using a conventional deposition technique over the insulating layer 422 as illustrated in FIGS. 8 and 9. The dielectric layer 822 can include one or more layers including silicon dioxide, alumina, hafnium oxide, silicon nitride, aluminum nitride, silicon oxynitride, another conventional gate dielectric material as used in the semiconductor arts, or any combination thereof. In another embodiment, thickness of the dielectric layer 822 is in a range of approximately 50 to 1000 nm.

A first semiconductor layer 842 and a second semiconductor layer 844 are sequentially formed over the substrate 300 and the conductive layer 624 as illustrated in FIGS. 8 and 9.

Each of the active regions 722, 724, 742, and 762 are formed using one or more conventional techniques. In one embodiment, the active regions 722, 724, 742, and 762 are formed as patterned layers by depositing the first and second semiconductor layers 842 and 844 using a stencil mask with one or more conventional techniques. In another embodiment, the active regions 722, 724, 742, and 762 are formed by blanket depositing the first and second semiconductor layers 842 and 844 and patterning the first and second semiconductor layers 842 and 844 using one or more conventional lithographic techniques.

Each of the first and second semiconductor layers 842 and 844 can include one or more materials conventionally used as semiconductors in electronic components. In one embodiment, the first semiconductor layer 842, the second semiconductor layer 844, or both are formed (e.g., deposited) as amorphous silicon (a-Si), low-temperature polysilicon (LTPS), continuous grain silicon (CGS), or any combination thereof. In another embodiment, other Group 14 elements (e.g., carbon, germanium), by themselves or in combination (with or without silicon), may be used for the first semiconductor layer 842, the second semiconductor layer 844, or both. In still other embodiments, the first and second semiconductor layers 842 and 844 include III-V (Group 13-Group 15) semiconductors (e.g., GaAs, InP, GaAlAs, etc.), II-VI (Group 2-Group 16 or Group 12-Group 16) semiconductors (e.g., CdTe, CdSe, CdZnTe, ZnSe, ZnTe, CuO, etc.), or any combination thereof. In yet further embodiments, the first and second semiconductor layers 442 and 444 include polyacetylene (PA) or any of its derivatives, polythiophene (PT) or any of its derivatives, poly(p-phenyl vinylene) (PPV) or any of its derivatives such as MEH-PPV, fullerene molecules such as $C_{60}$ or any of its derivatives, bucky tubes, anthracene, tetracene, pentacene, $Alq_3$ or other metal-chelate ($M-L_3$) type organometallic molecules, or any combination thereof. Either or both of the first and second semiconductor layers 442 and 444 can also be a composite comprising organic and inorganic materials or in the form of bi-layer or multiple-layers of such materials.

In one embodiment, the first semiconductor layer 842 includes silicon as the only semiconductor material, and the second semiconductor layer 844 includes germanium, silicon germanium, or another semiconductor material different from silicon alone or mixed with silicon. The significance of the different materials within the first and second semiconductor layers 842 and 844 will become apparent during a patterning sequence as described later in this specification.

The first semiconductor layer 842 is undoped or has n-type or p-type dopant at a concentration no greater than approximately $1 \times 10^{19}$ atoms/$cm^3$. The second semiconductor layer 844 includes an n-type or p-type dopant at a concentration heavier than the first semiconductor layer 842. In one embodiment, the second semiconductor layer 844 is $n^+$ or $p^+$ doped to at least $1 \times 10^{19}$ atoms/$cm^3$ in order to form ohmic contacts with subsequently-formed metal-containing structures. In another embodiment, the dopant concentration within the second semiconductor layer 844 is less than $1 \times 10^{19}$ atoms/$cm^3$ and forms Schottky contacts when contacted with subsequently-formed metal-containing structures. Conventional n-type dopant (phosphorous, arsenic, antimony, etc.) or p-type dopant (boron, gallium, aluminum, etc.) can be used. Such dopant can be incorporated during deposition or added during a separate doping sequence (e.g., implanting and annealing). The first and second semiconductor layers 842 and 844 are formed using conventional deposition and doping techniques. In one embodiment, the thickness of the first semiconductor layer 842 is in a range of approximately 30 to 550 nm, and the thickness of the second semiconductor layer 844 is in a range of approximately 50 to 500 nm. After reading this specification, skilled artisans will appreciate that other thicknesses may be used to achieve the desired electronic characteristics of the driving transistor 126.

The active region 762 formed in FIG. 9 has a pair of edges 922 and 926 as illustrated in FIG. 9. Note that the first and second semiconductor layers 842 and 844 are coterminous at each of the edges 922 and 926. Note that a portion of the conductive layer 624 extends to the right of the edge 926 in FIG. 9. That portion of the conductive layer 624 is a first electrode for the capacitive electronic component 124. The portion of the dielectric layer 822 to the right of the edge 926 and contacting the conductive layer 624 is the capacitor dielectric layer for the capacitive electronic component 124. The portion of the dielectric layer 822 to the left of the edge 926 and contacting the conductive layer 624 is the gate dielectric layer for the driving transistor 126. The active regions 722 and 742 have substantially the same pattern as the active region 762.

The dielectric layer 822 is patterned to form openings that expose the conductive plugs 424 and portions of the conductive members 722, 742, and 762. The openings over the conductive plugs 424 will allow subsequently-formed conductive members to connect to the data lines 132, 152, 172 and the $V_{dd1}$, $V_{dd2}$, $V_{dd3}$ lines 136, 156, and 176. The openings over the conductive members 722, 742, and 762 will allow subsequently-formed conductive members to connect the second source/drain regions of the select transistors 122 to the gate electrodes of the driving transistors 126 and the first electrodes of the capacitive electronic components 124.

Figure 10:
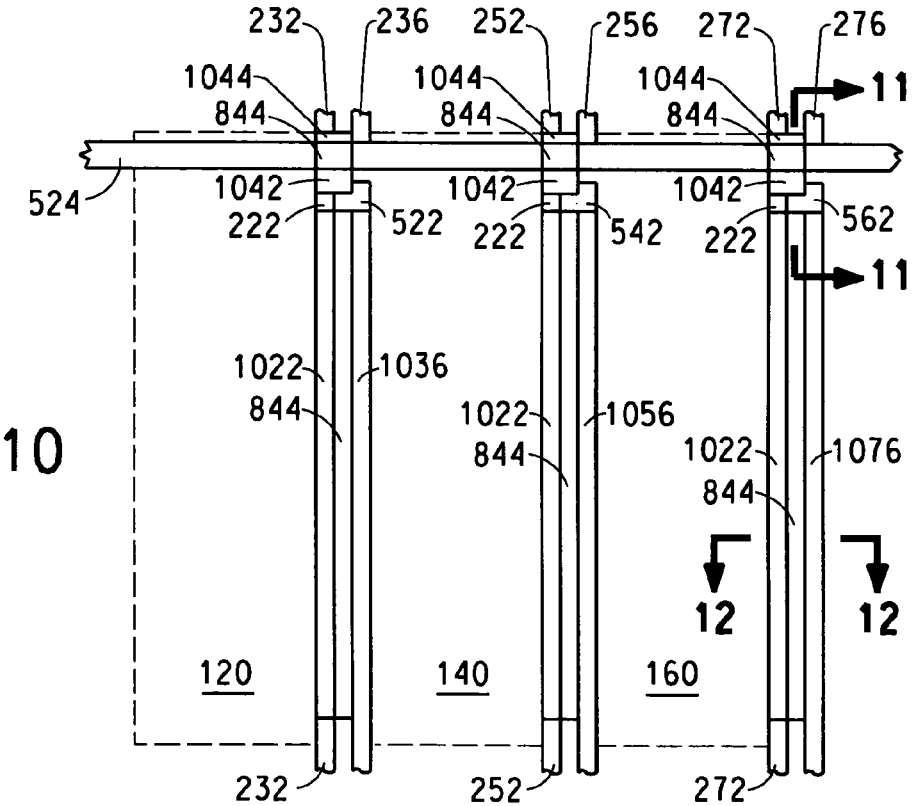
FIG. 10 includes an illustration of a plan view of the portion of an array of FIGS. 7 to 9 after forming a third set of conductive members.

Conductive members 1022, 1036, 1042, 1044, 1056, and 1076 are formed over the substrate 300 as illustrated in FIG. 10. In FIG. 10, the conductive members 1022 are contact structures for the first source/drain regions of the driving transistors 126, the conductive member 1036, 1056, and 1076 are contact structures for the second source/drain regions of the driving transistors 126, the conductive members 1042 are contact structures for the second source/drain regions of the select transistors 122, and the conductive members 1044 are contact structures for the first source/drain regions of the select transistors 122.

Conductive members 1022, 1036, 1042, 1044, 1056, and 1076 can be formed using a conventional technique. In one embodiment, a stencil mask may be used during a deposition operation to form the conductive members 1022, 1036, 1042, 1044, 1056, and 1076. In another embodiment, the conductive members 1022, 1036, 1042, 1044, 1056, and 1076 are formed by depositing one or more layers over substantially all of the substrate 300 and using a conventional lithographic technique to pattern the layer(s). Any of the materials and thicknesses described with respect to the conductive layer 324 may be used for the conductive members 1022, 1036, 1042, 1044, 1056, and 1076. In one embodiment, the conductive members 1022, 1036, 1042, 1044, 1056, and 1076 have substantially the same composition and thickness as the conductive layer 324. In another embodiment, the conductive members 1022, 1036, 1042, 1044, 1056, and 1076 have a different composition, thickness, or both compared to conductive layer 324.

Referring to FIG. 10, from a plan view of the electronic device, exposed portions of the second semiconductor layer 844 lies between each of: (1) conductive members 1042 and 1044; (4) conductive member 1022 (near the left-hand side of FIG. 10) and the conductive member 1036; (5) conductive member 1022 (near the center of FIG. 10) and the conductive member 1056; and (6) conductive member 1022 (near the right-hand side of FIG. 10) and the conductive member 1076.

In one embodiment, each of the spacings between conductive members over the second semiconductor layer 844 is approximately at a minimum dimension for the design rules used. In one embodiment, when 4-micron design rules are used, the spaces are approximately 4 microns each. In another embodiment, the spaces are more than the minimum dimension for the design rules. After reading this specification, skilled artisans will be able to choose a spacing between the drain and source contacts that best meets the needs or desires for a particular transistor design.

Figure 11:
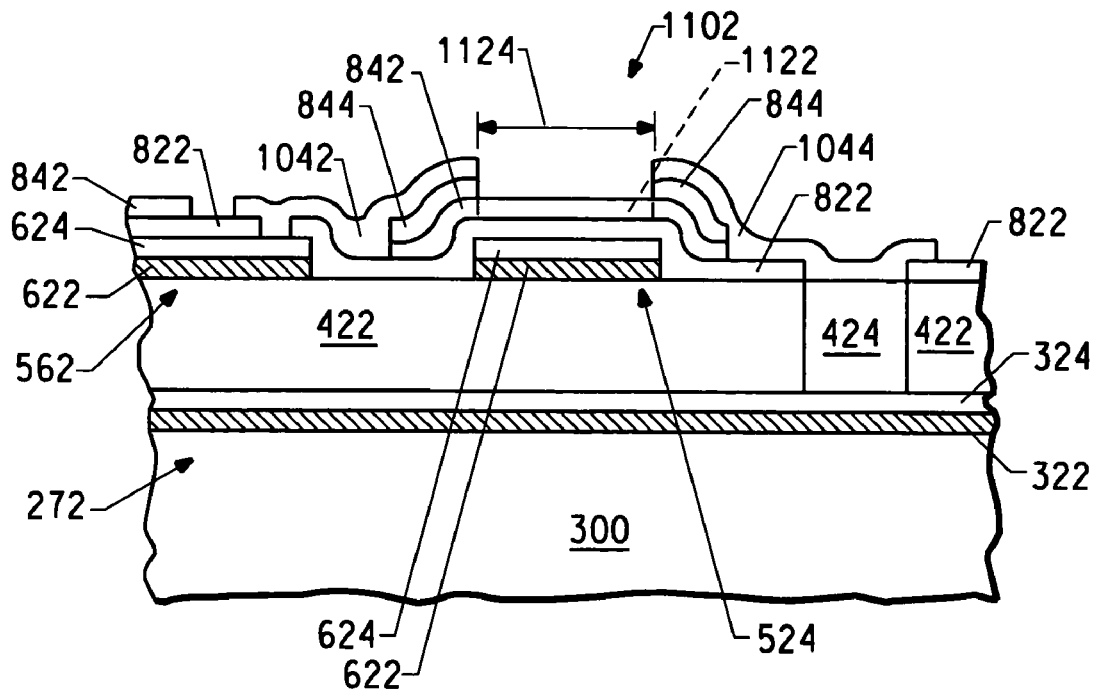
FIGS. 11 and 12 include illustrations of cross-sectional views of the portion of an array of FIG. 10 after etching a portion of the second semiconductor layer to define a channel region within the first semiconductor layer.
Figure 12:
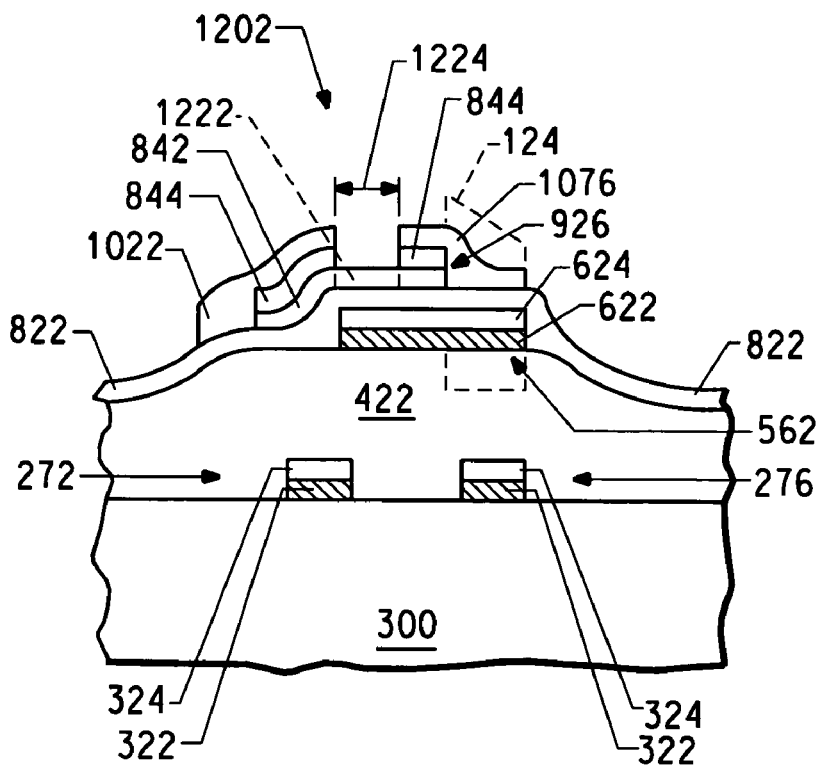

The exposed portions of the second semiconductor layer 844 are then removed to form openings 1102 and 1202 that extends through the second semiconductor layer 844 as illustrated in FIGS. 11 and 12. In this embodiment, the conductive members 1022, 1036, 1042, 1044, 1056, and 1076 are part of a hard mask when removing the exposed portions of the second semiconductor layer 844. Remaining portions of the second semiconductor layer 844 are source/drain regions for the select and driving transistors 122 and 126. Within the pixel 160, the channel region 1122 for the select transistor 122 is self-aligned to the conductive members 1042 and 1044, and the channel region 1222 for the driving transistor 126 is self-aligned to the conductive members 1022 and 1076. The channel regions 1122 and 1222 for the other select transistors 122 and driving transistors 126 are formed in substantially the same manner at substantially the same time. The select and driving transistors 122 and 126 are under-gated TFTs because the gate electrodes for those transistors underlie their corresponding channel regions 1122 and 1222. The portions of the dielectric layer 822 lying between the conductive member 524 and the overlying channel regions 1122 of the select transistors 122 and between the conductive members 522 and the overlying channel regions 1222 of the driving transistors 126 are the gate dielectric layers for those select and driving transistors 122 and 126.

Each of the physical channel lengths 1124 and 1224 of the channel regions 1122 and 1222, respectively, is the distance between portions of the second semiconductor layer 844 along the openings 1102 and 1202, respectively. In one embodiment, one or more of the physical channel lengths 1124 and 1224 are no more than two times the minimum dimension of the design rules. In another embodiment, one or more of the physical channel lengths 1124 and 1224 are no more than 1.2 times the minimum dimension of the design rules. In another embodiment, any one or more of the physical channel lengths 1124 and 1224 may be larger or smaller than those described.

The etch of the second semiconductor layer 844 may be performed using a wet or dry etch technique. In one embodiment, the etchants can be selected to allow the second semiconductor layer 844 to be removed selectively (i.e., etch at a higher rate) with respect to the conductive members 1022, 1036, 1042, 1044, 1056, and 1076.

In one embodiment, a halogen-containing plasma may be used by performing a dry etching technique to remove the exposed portion of the second semiconductor layer 844. The feed gas can include a halogen-containing gas, such as a fluorine-containing gas. The halogen-containing gas can have a formula of $C_aX_bH_c$, wherein X is one or more halogens, a is 1 or 2, b is at least one, and b+c is 4 if a is 1 and b+c is 4 or 6 if a is 2. For example, when X is F, the halogen-containing gas is a fluorocarbon. In another embodiment, the fluorine-containing gas can include $F_2$, HF, $SF_6$, $NF_3$, a fluorine-containing interhalogen (ClF, $ClF_3$, $ClF_5$, $BrF_3$, $BrF_5$, and $IF_5$), or any mixture thereof. In another embodiment, the halogen-containing gas is a chlorine-containing gas including $Cl_2$, HCl, $BCl_3$, a chlorine-containing interhalogen (ClF, $ClF_3$, and $ClF_5$), or any mixture thereof. In still another embodiment, the halogen-containing gas is a bromine-containing gas including $Br_2$, HBr, $BBr_3$, a bromine-containing interhalogen ($BrF_3$ and $BrF_5$), or any mixture thereof. In yet another embodiment, the halogen-containing gas is an iodine-containing gas including $I_2$, HI, or any mixture thereof. In still a further embodiment, the halogen-containing gas is any mixture of gases described in this paragraph. In a specific embodiment, the etching selectivity between the second semiconductor layer 444 and the first semiconductor layer 442 (i.e., ratio of the etch rate of the second semiconductor layer 444 to the etch rate of the first semiconductor layer 442) can be improved by using more of the heavier halogens as compared to fluorine. For example, the etching selectivity improves with $CF_{(1-y)}Cl_y$ as y increases.

The feed gas can include any one or more oxygen-containing gases, such as of $O_2$, $O_3$, $N_2O$, or other oxygen-containing gas conventionally used for creating an oxygen plasma within the semiconductor arts. The feed gas can also include one or more inert gases (e.g., a noble gas, $N_2$, $CO_2$, or any combination thereof.

The etch can be performed within an etch chamber. During the etch, the pressure is in a range of approximately 0.01 to 5000 mTorr. At these pressures, the feed gas(es) may flow at a rate in a range of approximately 10 to 1000 standard cubic centimeters per minute ("sccm"). In another embodiment, the pressure may be in a range of approximately 100 to 500 mTorr, the feed gas(es) may flow at a rate in a range of approximately 100 to 500 sccm. The voltage and power may be applied to generate a plasma. Power is typically a linear or near linear function of the surface area of the substrate. Therefore, power densities (in power per unit area of substrate) are given. The voltage is in a range of approximately 10 to 1000 V, and the power density is in a range of approximately 10 to 5000 mW/cm². In one embodiment, the voltage may be in a range of approximately 20 to 300 V, and the power density may be in a range of approximately 50 to 500 mW/cm².

The etch may be performed as a timed etch or by using endpoint detection with a timed overetch. If the first and second semiconductor layers 842 and 844 are mostly silicon, a timed etch may be used. If dissimilar materials are used for the first and second semiconductor layers 842 and 844, endpoint detection may be used. For example, in one embodiment, if the second semiconductor layer 844 includes silicon germanium, endpoint detection may be based on the absence of germanium in the effluent from the etch chamber after the first semiconductor layer 842 becomes exposed. In another embodiment, if the second semiconductor layer 844 includes germanium with nearly no silicon, endpoint detection may be based on the presence of silicon within the effluent from the etch chamber after the first semiconductor layer 842 is exposed. A timed overetch may be used to ensure that portions of the second semiconductor layer 844 are removed from areas of the substrate 300 where etching occurs more slowly. In one embodiment, the power density during the etch may be decreased during the overetch to improve selectivity of the second semiconductor layer 844 to the first semiconductor layer 842 and other portions of the electronic device exposed to the etching plasma.

Wet chemical etchants selected will be based in part on the composition of the second semiconductor layer 844 and other portions of the electronic device exposed during the etch. In one embodiment, the etchant can include a base (e.g., KOH, tetramethyl ammonium hydroxide, etc.) or a combination of an oxidizer (e.g., $HNO_3$) and HF. A timed etch is typically used for wet chemical etching.

After the etching is completed, some or none of the first semiconductor layer 842 may be removed. In one embodiment, no more than approximately 50 nm of the first semiconductor layer 842 is removed.

Referring to FIG. 11, within pixel 160 the conductive members 1044 contacts the conductive plug 424, which in turn contacts the conductive member 272. Signals along the data line 172 are transmitted along the conductive member 424 and conductive member 1044 to the portion of the second semiconductor layer 844 closer to the right-hand side of FIG. 11. The conductive member 1042 contacts the portion of the second semiconductor layer 844 (just to the left of the center in FIG. 11) and the conductive layer 624 of the conductive member 562. Substantially the same structures are present within pixels 120 and 140.

Referring to FIG. 12, within pixel 160, the portion of the conductive member 1076 lying to the right of edge 926 is the second electrode for the capacitive electronic component 124 within pixel 160. The portion of the conductive member 1076 lying to the left of edge 926 is part of the contact structure for the second source/drain region (a remaining portion of the second semiconductor layer 844) of the driving transistor 126 within the pixel 160. The capacitive electronic component 124, illustrated with a dashed line in FIG. 12, within pixel 160 includes the portions of the conductive layer 624, the dielectric layer 822, and conductive member 1076 that lie to the right of the edge 926. The capacitive electronic components 124 for the pixels 120 and 140 have similar structures. Similarly, portions of the conductive members 1036 and 1056 are second electrodes for the capacitive electronic components of the pixels 120 and 140, respectively.

At this point in the process, the formation of the electronic components within the pixel driving circuits is substantially complete. Referring to FIG. 11, within pixel 160, the portion of the second semiconductor layer 844 underlying the conductive member 1044 is a first source/drain region for the select transistor 122, and the portion of the second semiconductor layer 844 underlying the conductive member 1042 is a second source/drain region for the select transistor 122. The portion of the conductive member 524 that underlies the first semiconductor layer 842 is the gate electrode for the select transistor 122. The portion of the first semiconductor layer exposed beneath the opening 1102 is the channel region 1122 of the select transistor 122. The other select transistors 122 within the other pixels 120 and 140 are substantially identical to those illustrated in FIG. 11.

Referring to FIG. 12, within pixel 160, the portion of the conductive member 562 to the left of the edge 926 includes the gate electrode for the driving transistor 126. The portion of the conductive member 562 to the right of the edge 926 is the first electrode for the capacitive electronic component 124. The portion of the second semiconductor layer 844 underlying the conductive member 1022 is a first source/drain region for the driving transistor 126, and the portion of the second semiconductor layer 844 underlying the conductive member 1076 and to the right of the edge 926 is a second source/drain region for the driving transistor 126. The portion of the first semiconductor layer exposed beneath the opening 1202 is the channel region 1222 of the driving transistor 126. The portion of the conductive member 1076 to the right of the edge 926 is the second electrode for the capacitive electronic component 124. The other driving transistors 126 and capacitive electronic components 124 within the other pixels 120 and 140 are substantially identical to those illustrated in FIG. 12.

Figure 13:
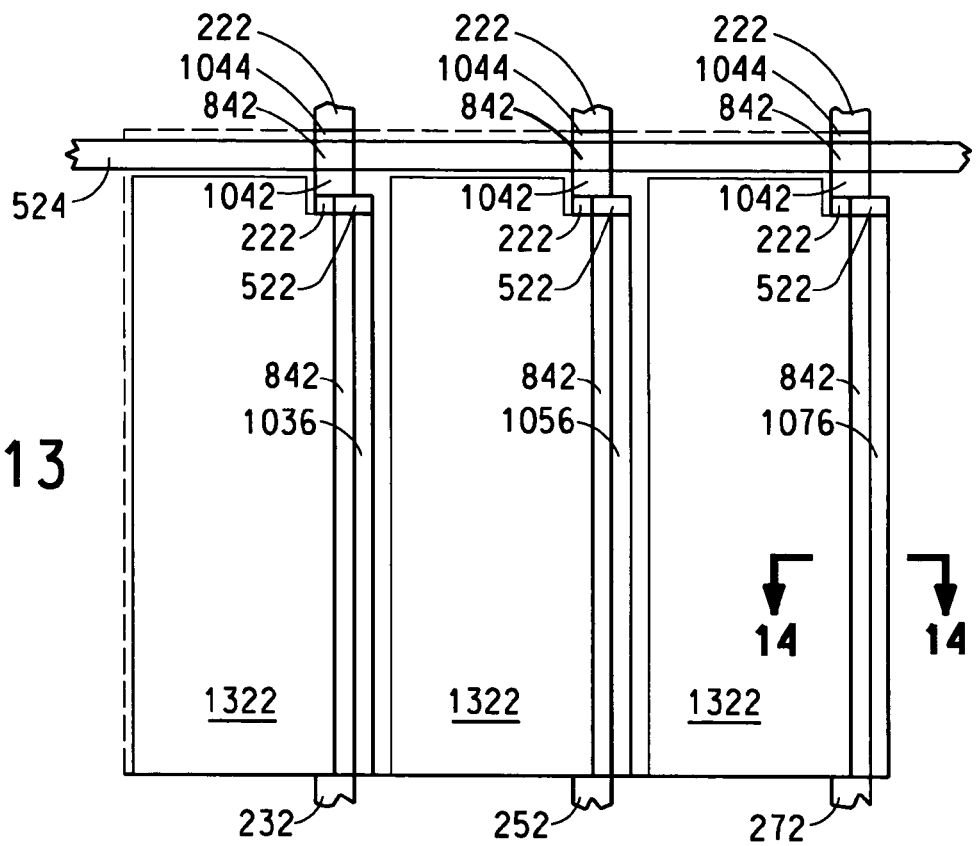
FIGS. 13 and 14 include illustrations of a plan view and a cross-sectional view, respectively, of the portion of an array of FIGS. 11 and 12 after forming electrodes for radiation-emitting or radiation-responsive components.

An insulating layer and contact openings within the insulating layer are formed over portions of the substrate 300. Conductive members 1322 are formed over portions of the substrate 300 as illustrated in FIG. 13. Conductive members 1322 are first electrodes for the electronic components 128, 148, 168 and are connected to the underlying conductive members 1022. Referring to FIG. 13, from a plan view, each of the edges of the conductive members 1322 closer to the right-hand side extend to or overlies the conductive members 232, 252, or 272, each of the edges of the conductive members 1322 closer to the left-hand side extend to or overlies the conductive members 256 or 276 or the $V_{dd}$ line for the pixel (not illustrated) to the left of the pixel 120. Each of the edges of the conductive members 1322 closer to the top extend to or overlies the conductive member 524, each of the edges of the conductive members 1322 closer to the bottom extend to or overlies the conductive member for the select line for the pixel (not illustrated) below of the pixels 120, 140, or 160.

Figure 14:
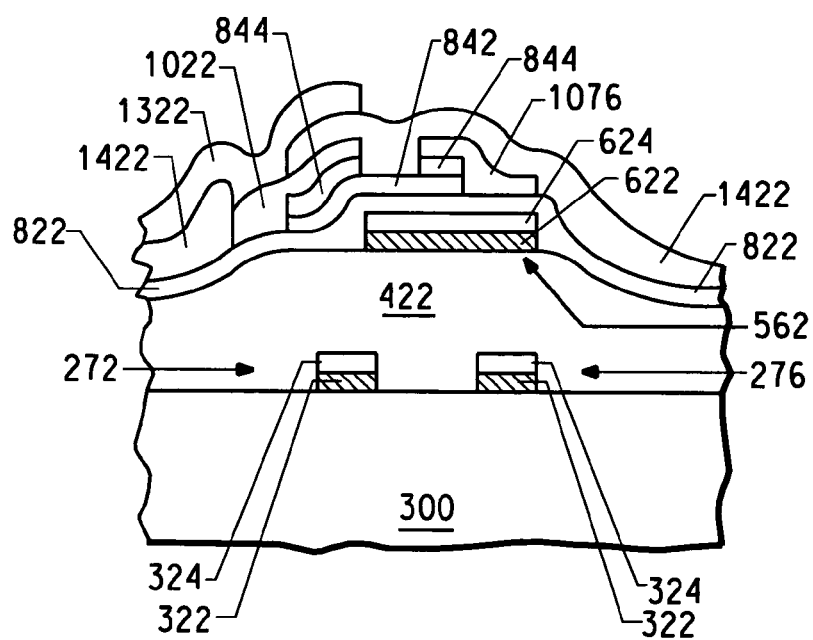

FIG. 14 includes a cross-sectional view at sectioning line 14-14 in FIG. 13 and illustrates the fabrication of the electronic device after the conductive members 1322 are formed. The insulating layer 1422 and openings within the insulating layer 1422 can be formed using one or more conventional techniques. In one embodiment, the insulating layer 1422 is deposited as a patterned layer using a stencil mask. In another embodiment, the insulating layer 1422 can be blanket deposited over substantially all of the substrate 300 and patterned using a conventional lithographic technique. The insulating layer 1422 can include one or more layers of any of the materials previously described with respect to the dielectric layer 822. The thickness of the insulating layer 1422 is in a range of approximately 0.1 to 5.0 microns.

The conductive members 1322 can include one or more layers of one or more materials conventionally used for an anode in a conventional OLED. The conductive members 1322 can be formed using a conventional deposition or by a conventional deposition and patterning sequence.

In one embodiment, the conductive members 1322 transmit at least 70% of the radiation to be emitted from or responded to by subsequently-formed organic active layer(s). In one embodiment, the thickness of the conductive members 1322 is in a range of approximately 100 to 200 nm. If radiation does not need to be transmitted through the conductive members 1322, the thickness may be greater, such as up to 1000 nm or even thicker.

Figure 15:
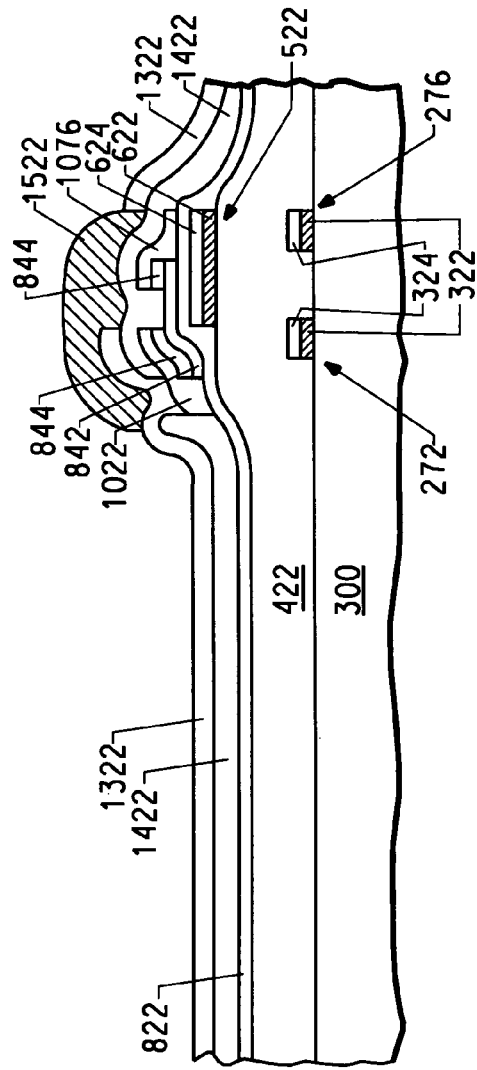
FIG. 15 include illustrations of a cross-sectional view of the portion of an array of FIGS. 13 and 14 after forming a substrate structure over at least portions of the pixel driving circuits.

A substrate structure 1522 is formed over the pixel driving circuits as illustrated in FIG. 15. In one embodiment, the substrate structure 1522 is a well structure, and in another embodiment the substrate structure 1522 can be a liquid guide structure (i.e., having shapes in the form of strips rather than a lattice). In one embodiment, at least portions of the substrate structure 1522 lie between the electronic components 128, 148, 168, or any combination thereof and at least portions of the select and driving transistors 122 and 126 (e.g., at least half of the select and driving transistors 122 and 126). In another embodiment, substantially all of the pixel driving circuits, including the select and driving transistors 122 and 126 and capacitive electronic components 124, are covered by the substrate structure 1522. In yet another embodiment, the channel regions of the select and driving transistors 122 and 126 are covered by the substrate structure 1522.

FIG. 15 also illustrates the positional relationship between a portion of the substrate structure 1522 and the underlying driving transistor 126 and capacitive electronic component 124 within pixel 160. The substrate structure 1522 overlies a substrate 300 and portions of the conductive members 1022. The substrate structure 1222 defines an array of openings where radiation can be transmitted to or from a subsequently-formed organic active layer. The openings within the substrate structure 1522 expose portions of the conductive members 1322.

In a specific embodiment, the substrate structure 1522 includes an inorganic (e.g., silicon dioxide, silicon nitride, aluminum oxide, aluminum nitride, etc.) or organic material (e.g., photoresist, polyimide, etc.), or any combination thereof. In another embodiment, the substrate structure 122 can include a black layer (e.g., layer including carbon) in order to increase contrast to ambient light while the electronic device is being operated. In one exemplary embodiment, the substrate structure 1222 may be formed from one or more resist or polymeric layers. The resist may, for example, be a negative resist material or positive resist material.

The resist can be deposited over the substrate 300 and conductive members 1322 using a conventional technique. The substrate structure 1522 may be patterned as deposited or may be deposited as a blanket layer and patterned using a conventional lithographic technique. In one particular embodiment, the substrate structure 1522 has a thickness between approximately 2 to 10 microns as viewed from a cross-sectional view. In one exemplary embodiment, openings within the substrate structure 1522 are in a range of approximately 50 to 100 microns wide and in a range of approximately 100 to 500 microns long when viewed from a plan view. The slope of the substrate structure 1522 at the openings may be less than 90° approximately 90°, or more than 90° with respect to the surface of the conductive members 1322.

In one embodiment, the substrate structure 1522 may or may not receive a surface treatment before forming a subsequent organic layer. A conventional fluorination surface treatment may be performed to reduce the surface energy of the substrate structure 1222.

Figure 16:
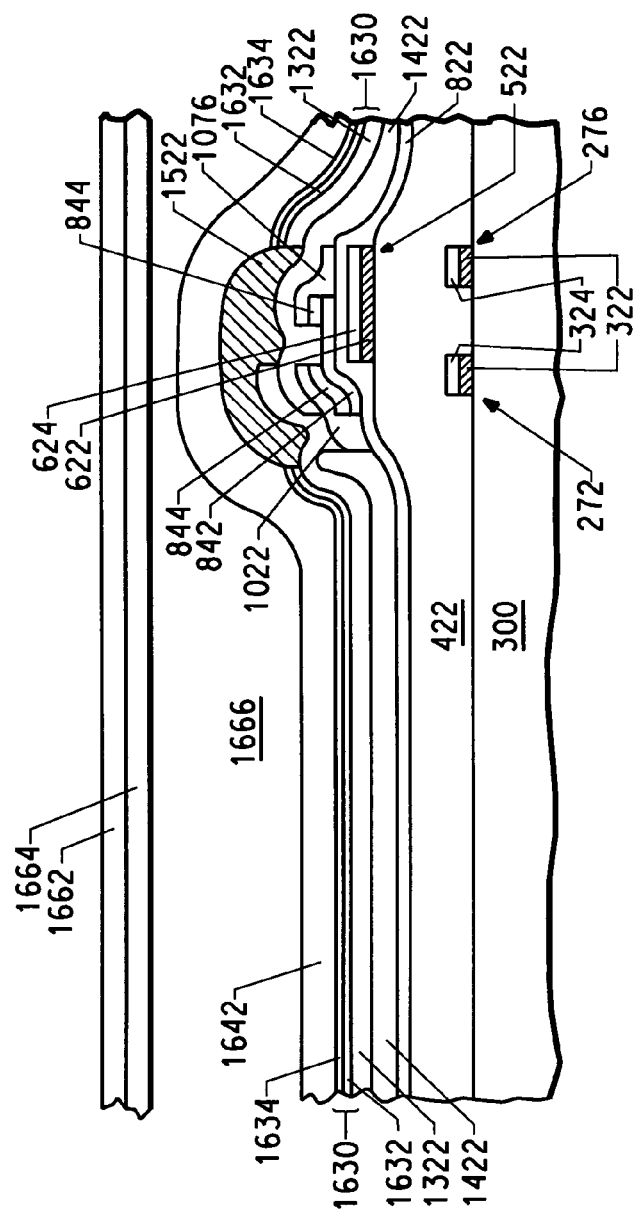
FIG. 16 includes an illustration of a cross-sectional view of the portion of an array of FIG. 15 after forming a substantially completed electronic device.

Processing continues to form a substantially completed electronic component as illustrated in FIG. 16. An organic layer 1630 and a second electrode 1642 are formed over the substrate 300. The organic layer 1630 may include one or more layers. The organic layer 1630 includes an organic active layer 1634, and optionally, may contain any one or more of a charge-injection layer, a charge-transport layer, a charge-blocking layer, or any combination thereof. The optional charge-injection layer, charge-transport layer, charge-blocking layer, or any combination thereof may lie a between the organic active layer 1634 and the conductive members 1322, between the organic active layer 1634 and the second electrode 1642, or a combination thereof. In one embodiment, a hole-transport layer 1632 lies between the conductive members 1322 and the organic active layer 1434.

The formation of the organic layer 1630 is performed using any one or more conventional techniques used in forming organic layers in OLEDs. The hole-transport layer 1632 has a thickness in a range of approximately 50 to 200 nm, and the organic active layer 1634 has a thickness in a range of approximately 50 to 100 nm. In one embodiment, only one organic active layer 1634 is used in the array. In another embodiment, different organic active layers may be used in different parts of the array.

The second electrode 1642 includes one or more layers of one or more materials used for a cathode in a conventional OLED. The second electrode 1642 is formed using one or more conventional deposition or conventional deposition and lithographic techniques. In one embodiment, the second electrode 1642 has a thickness in a range of approximately 0.1 to 5.0 microns. In a specific embodiment, the second electrode 1642 can be a common cathode for the array.

Other circuitry not illustrated in FIG. 16 may be formed using any number of the previously described or additional layers. Although not shown, additional insulating layer(s) and interconnect level(s) may be formed to allow for circuitry in peripheral areas (not shown) that may lie outside the array. Such circuitry may include row or column decoders, strobes (e.g., row array strobe, column array strobe), or sense amplifiers. Alternatively, such circuitry may be formed before, during, or after the formation of any layers shown in FIG. 14. In one embodiment, the second electrode 1642 is part of the $V_{ss}$ line 138.

A lid 1662 with a desiccant 1664 is attached to the substrate 300 at locations (not illustrated in FIG. 16) outside the array to form a substantially completed device. A gap 1666 may or may not lie between the second electrode 1642 and the desiccant 1664. The materials used for the lid and desiccant and the attaching process are conventional.

4. Other Embodiments

The embodiments described above are well suited for AMOLED displays including monochromatic and full color displays. Still, the concepts described herein can be used for other types of radiation-emitting electronic components. Other radiation-emitting electronic components can include passive matrix displays light panels, inorganic LEDs, including III-V or II-VI-based inorganic radiation-emitting components. In one embodiment, the radiation-emitting electronic components may emit radiation within the visible light spectrum, and in another embodiment, the radiation-emitting electronic component may emit radiation outside the visible light spectrum (e.g., UV or IR).

In another embodiment, the concepts described herein may be extended to other types of electronic devices. In one embodiment, a sensor array may include an array of radiation-responsive electronic components. In one embodiment, different radiation-responsive electronic components may have the same or different active materials. The response of those active materials may change over time. Further, some of the sensor array may have different portions that receive different wavelengths, different radiation intensities, or a combination thereof. Similar to an electronic device with radiation-emitting electronic components, the lifetime of an electronic device with radiation-responsive electronic components may have a longer useful life.

Radiation may be transmitted through the substrate 300, the lid 1662, or both. If radiation were to be transmitted through the lid 1662, the lid would allow at least 70% of the radiation to be transmitted through it. The desiccant 1664 can be modified to allow at least 70% of the radiation to be transmitted through it or located at position(s), such that radiation can be emitted from or received by the organic active layer 1634 via the lid 1662. For example, the desiccant may overlie the substrate structure 1522 and not the organic active layer 1634. In another embodiment, the compositions of the conductive members 1322 and second electrode 1642 can be reversed. In this embodiment, cathodes are closer to the substrate 300 as compared to a common anode. The pixel driving circuit and interconnects between electronic components may be modified for such a structure.

The capacitance of the capacitive electronic components 124 can be increased or decreased by changing the overlap between any one or more of the conductive members 524 and its overlying conductive member 1036, 1056, or 1076.

Many dimensions, including thicknesses, widths, and lengths, have been given with respect to some embodiments. The scope of the present invention is not limited to those dimensions or ranges of dimensions. After reading the specification, skilled artisans will appreciate that other dimensions can be used.

5. Advantages

The layout and electronic component structures described herein can allow a more efficient use of space within a pixel to increase the aperture ratio of the pixel compared to conventional pixels. The capacitive electronic components 124 are integrated into the pixel, and its capacitance can be adjusted by changing the overlap between the conductive members 522, 542, or 562 and its corresponding overlying conductive member 1036, 1056, or 1076. Also, the select and driving transistors 122 and 126 lie along the same side of a pixel. More specifically, the transistors lie between one of the radiation-emitting or radiation-responsive area of the pixel and one of the longer sides of the pixels. Both of the select and driving transistors 122 and 126 within the pixel lie closer to that longer side of the pixel as compared to opposite longer side of that pixel. The pixel driving circuit extends at least half way along the length of the pixel.

The layout of the pixels 120 has the different patterned layers at different elevations from the primary surface of the substrate 300. Within the pixels 120, 140, and 160, the data lines 132, 152, and 172 correspond to conductive members 232, 252, and 272, and $V_{dd1}$, $V_{dd2}$, and $V_{dd3}$ lines 136, 156, and 176 correspond to conductive members 236, 256, and 276. Within the pixels 120, 140, and 160, the data lines 132, 152, and 172 and $V_{dd1}$, $V_{dd2}$, and $V_{dd3}$ lines 136, 156, and 176 lies at an elevation closest to the primary surface of the substrate 300 as compared to the select line 134, conductive members 522, 524, 542, 544, active regions 722, 724, 742, an 762, conductive members 1022, 1042, 1044, 1036, 1056, and 1076, first electrodes 1322 and second electrode 1642. In one embodiment, the select transistors 122 includes the active regions 724 and portions of the select line 134, which corresponds to conductive member 524 within the pixels 120, 140, and 160.

An aperture ratio greater than 40% can be achieved. In one embodiment, the aperture ratio is at least 50%, and in one another embodiment, the aperture ratio is at least 53%, in still another embodiment, the aperture ratio is at least 56%. In one specific embodiment, a pixel is 80 microns by 240 microns. At 4-micron design rules, the width and length of the radiation-emitting or radiation-responsive area can be 64 and 236 microns, respectively, and results in an aperture ratio of approximately 78%. Even if the widths of the data, select, $V_{dd1}$, $V_{dd2}$, and $V_{dd3}$ lines within the pixels are doubled, the aperture ratio is still at least 65%.

Such aperture ratios have not been achieved in conventional bottom emission organic electronic devices. The larger aperture ratio can allow the pixel circuits, including the driving transistors 126 and electronic components 128, 148, and 168 to be operated at less aggressive conditions (i.e., lower current) and still achieve a desired intensity. By reducing the current, the lifetime of the electronic device is extended because the driving transistors 126 and the electronic components 128, 148, and 168 are not degraded as quickly.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of the invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges includes each and every value within that range.

What is claimed is:

1. An organic electronic device comprising a pixel having a first long side and a second long side opposite the first long side, wherein the pixel comprises:
   a pixel driving circuit comprising a select transistor and a driving transistor; and
   a first electronic component coupled to the pixel driving circuit,
   wherein:
      the organic electronic device is a bottom emission electronic device comprising a transparent anode and a cathode, wherein the select and driving transistors lie nearer the first long side than the second long side of the pixel; length of the driving circuit is at least 50% of the first long side of the pixel; and
      the pixel has an aperture ratio of at least 53%.

2. The organic electronic device of claim 1, wherein the aperture ratio is at least 56%.

3. The organic electronic device of claim 1, wherein the pixel comprises the long side that extends along a length of the pixel, wherein:
   the first electronic component has a radiation-emitting or radiation-responsive area;
   from a plan view, all electronic components within the pixel driving circuit lie between the side of the pixel and the radiation-emitting or radiation-responsive area of the first electronic component.

4. The organic electronic device of claim 3, further comprising a substrate structure comprising a black layer that lies between at least a portion of the pixel driving circuit and the radiation-emitting or radiation-responsive area of the first electronic component.

5. The organic electronic device of claim 3, further comprising:
   a substrate;
   a data line connected to the select transistor; and
   a power supply line coupled to the driving transistor,
   wherein within the pixel, each of the data line and the power supply line lie closer to the substrate compared to the select transistor.

6. The organic electronic device of claim 1, wherein:
a data line is coupled to the pixel;
a power supply line is coupled to the pixel,
from a plan view, the data line and the power supply line have lengths that extend along the length of the pixel and lie closer to the first long side compared to the second long side.

7. A bottom emission organic electronic device comprising a transparent anode, a cathode, and:
a first pixel having a first long side and a second long side opposite the first long side, wherein the first and second long sides extend along a length of the first pixel;
a data line coupled to the first pixel;
a pixel driving circuit; and
a first power supply line coupled to the first pixel,
wherein, from a plan view, the data line and the first power supply line have lengths that extend along the length of the first pixel and lie closer to the first long side compared to the second long side; the pixel driving circuit extends along at least 50% of the first long side of the pixel; and the pixel has an aperture ratio of at least 53%.

8. The organic electronic device of claim 7, further comprising a substrate, wherein:
the first pixel comprises a select transistor and a driving transistor;
the data line is connected to the select transistor; and
the first power supply line is coupled to the driving transistor,
within the first pixel, each of the data line and the first power supply line lie closer to the substrate compared to the select transistor.

9. The organic electronic device of claim 8, further comprising a substrate and a select line, wherein within the first pixel:
each of the data line and the first power supply line lies between the substrate and the select line; and
the select line lies between the substrate and a channel region of the select transistor.

10. The organic electronic device of claim 8, further comprising an electronic component, wherein the electronic component is connected to the driving transistor and a second power supply line.

11. The organic electronic device of claim 7, wherein the first pixel further comprises:
a first electronic component having a radiation-emitting or radiation-responsive area;
wherein from the plan view:
all electronic components within the pixel driving circuit lie between the first long side of the first pixel and the radiation-emitting or radiation-responsive area of the first electronic component.

12. The organic electronic device of claim 11, further comprising a second pixel comprising a second electronic component, wherein:
the second electronic component has a radiation-emitting or radiation-responsive area; and
from the plan view, substantially none of the pixel driving circuit of the first pixel lies between the radiation-emitting or radiation-responsive areas of the first and second electronic components.

13. A bottom emission organic electronic device comprising:
a substrate;
a data line;
a first power supply line; and
a first pixel, wherein:
the first pixel comprises a pixel driving circuit overlying the substrate, wherein the pixel driving circuit comprises a select transistor and a driving transistor;
the pixel driving circuit extends at least 50% of a first long side of the first pixel;
the data line is connected to the select transistor;
the first power supply line is coupled to the driving transistor; and
within the first pixel, each of the data line and the first power supply line lies closer to the substrate compared to the select transistor; and the pixel has an aperture ratio of at least 53%.

14. The organic electronic device of claim 13, further comprising a select line, wherein within the first pixel:
each of the data line and the first power supply line lies between the substrate and the select line; and
the select line lies between the substrate and a channel region of the select transistor.

15. The organic electronic device of claim 13, further comprising a first electronic component, wherein the first electronic component is connected to the driving transistor and a second power supply line.

16. The organic electronic device of claim 13, wherein the first pixel comprises:
a first long side that extends along a length of the first pixel; and
a first electronic component having a radiation-emitting or radiation-responsive area,
wherein from a plan view:
all electronic components within the pixel driving circuit lie between the first long side of the first pixel and the radiation-emitting or radiation-responsive area of the first electronic component.

17. The organic electronic device of claim 16, further comprising a second pixel comprising a second electronic component, wherein:
the second electronic component has a radiation-emitting or radiation-responsive area; and
from the plan view, substantially none of the pixel driving circuit of the first pixel lies between the radiation-emitting or radiation-responsive areas of the first and second electronic components.

18. The organic electronic device of claim 13, wherein, from a plan view, the data line and the power supply line have lengths that extend along a length of the first pixel and lie closer to the first long side compared to a second long side.

* * * * *

UNITED STATES PATENT AND TRADEMARK OFFICE
CERTIFICATE OF CORRECTION

PATENT NO. : 7,612,368 B2 Page 1 of 1
APPLICATION NO. : 11/025122
DATED : November 3, 2009
INVENTOR(S) : Gang Yu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 418 days.

Signed and Sealed this

Nineteenth Day of October, 2010

David J. Kappos
*Director of the United States Patent and Trademark Office*